United States Patent [19]

Deitch

[11] 3,791,887

[45] Feb. 12, 1974

[54] LIQUID-PHASE EPITAXIAL GROWTH UNDER TRANSIENT THERMAL CONDITIONS

[75] Inventor: Richard Deitch, Bayside, N.Y.

[73] Assignee: GTE Laboratories Incorporated, Waltham, Mass.

[22] Filed: June 28, 1971

[21] Appl. No.: 157,525

[52] U.S. Cl. .......... 148/172, 148/171, 252/62.3 GA, 117/201

[51] Int. Cl. .............................................. H01l 7/38

[58] Field of Search ............ 148/172, 171; 117/201; 252/62.3 GA

[56] References Cited

UNITED STATES PATENTS

| | | | |
|---|---|---|---|
| 2,871,149 | 1/1959 | Lehovac | 148/171 |
| 3,565,702 | 2/1971 | Nelson | 148/172 |
| 3,611,069 | 10/1971 | Galginaitis et al. | 148/171 UX |
| 3,631,836 | 1/1972 | Jarvela et al. | 148/171 X |
| 3,677,836 | 7/1972 | Lorenz | 148/171 |
| 3,664,294 | 5/1972 | Solomon | 148/171 X |

*Primary Examiner*—G. T. Ozaki
*Attorney, Agent, or Firm*—Irving M. Kriegsman; Robert A. Walsh

[57] ABSTRACT

Thin epitaxial layers of material are grown on a substrate from a saturated solution of a solute dissolved in a metal solvent. The solute and solvent are first mixed and then heated to produce the saturated solution. The solution temperature is maintained while a suitable substrate is heated to and maintained at a temperature which is at least 5°C lower than that of the solution. The substrate is then brought into contact with the solution. Upon contact, a supersaturated condition is produced in the solution proximate to the substrate and a thin epitaxial layer of solute material grows on the substrate as the substrate and solution temperatures approach equilibrium. Layer growth continues until all the supersaturation in the solution is relieved or until the substrate and solution are physically separated.

8 Claims, 7 Drawing Figures

INVENTOR.
Richard Deitch
BY [signature]
ATTORNEY.

INVENTOR.
Richard Deitch

BY [signature]
ATTORNEY.

LIQUID-PHASE EPITAXIAL GROWTH UNDER TRANSIENT THERMAL CONDITIONS

BACKGROUND OF THE INVENTION

The invention relates to a method for the epitaxial growth of thin layers of semiconductor compounds from molten metal solutions. Epitaxial layers of single-element, binary, ternary, and mixed crystal semiconductor compounds have been grown from solutions in molten metals by a process known as liquid-phase epitaxy (LPE).

In the process of liquid-phase epitaxy, a solute, which is the desired product of the growth, is dissolved in a suitable solvent and heated to a temperature to produce a saturated solution. A substrate, which is generally of the same composition as the solute, is heated to a temperature approximately equal to that of the solution and then brought into contact with the solution. The temperature is then usually raised a few degrees to etch back a portion of the surface of the substrate. Next, the temperature is lowered in a controlled manner, typically at a rate of less than 5°C/min, during which time layer growth occurs on the substrate. Growth is usually halted by separating the substrate and solution after a predetermined period of time. Since the temperatures of the substrate and solution are substantially equal during the entire growth period, growth occurs under conditions of thermal equilibrium.

Liquid-phase epitaxy is particularly useful for preparing devices, such as light-emitting diodes, which require layers of material having a thickness in a range of 100 – 250 micrometers. However, many solid-state devices, such as avalanche diodes and field effect transistors, require thin epitaxial layers of material. As used herein, a thin layer of material shall be defined as being less than 10 micrometers thick.

By using slow growth rates, liquid-phase epitaxy under conditions of thermal equilibrium has been used to grow thin epitaxial layers of gallium arsenide on gallium arsenide substrates. For example, by lowering the temperature at the rate of 0.2°C per minute for 14 minutes a layer of gallium arsenide 6 micrometers thick was grown. For the growth of thinner layers, more precise temperature control, typically ± 0.01°C, is required.

This invention is directed to a method of growing layers of material on a substrate by liquid-phase epitaxy under transient thermal conditions. More specifically, the method permits the relatively rapid growth of thin epitaxial layers without the requirements of slow cooling rates or precise temperature control. This method is particularly well suited for the preparation of solid-state devices where the growth and/or preservation of abrupt junctions are of particular importance.

SUMMARY OF THE INVENTION

The method of this invention is carried out by heating a solution containing a metal solvent and a solute material, which is the desired product of the growth, to a temperature at which a saturated solution results. The temperature of the solution is then maintained at this value and a substrate, which may have the same composition as the solute or may be composed of any material on which a layer of the solute is known to grow, is heated to a temperature which is at least 5°C lower than the temperature of the solution. The substrate is then brought into contact with the solution inducing a supersaturated condition in the solution proximate to the substrate. The external temperature of the solution is maintained constant. After a predetermined period of time, during which an epitaxial layer of known thickness will grow, the substrate and solution are separated. Since the growth rate decreases as the temperatures of the substrate and solution approach a constant value, growth occurs in a self-regulating manner. Growth in the transient mode will cease when the super-saturation in the solution proximate to the substrate is completely relieved.

Specifically, the method of this invention was used to grow thin epitaxial layers of gallium arsenide on gallium arsenide substrates. Gallium arsenide was added to gallium metal and the temperature was raised to dissolve the gallium arsenide and produce a saturated solution. A gallium arsenide substrate was heated to a temperature at least 5°C lower than that of the solution. Preferably, the temperature of this substrate is between 50°C – 100°C lower than that of the solution. The substrate was then brought into contact with the hotter solution, the external heating of the solution being maintained constant, and, after a predetermined period of time, the substrate was separated from the solution. In one specific example, the temperature of the saturated gallium solution was about 800°C, and the temperature of the gallium arsenide substrate was about 750°C. Under these conditions, an epitaxial layer approximately 1 micrometer thick was grown on a substrate after 3 seconds contact with the solution and a layer about 3 micrometers thick was grown on another substrate after 15 seconds contact with the solution.

DESCRIPTION OF THE PREFERRED EMBODIMENT

Figures 1, 2A, 2B:
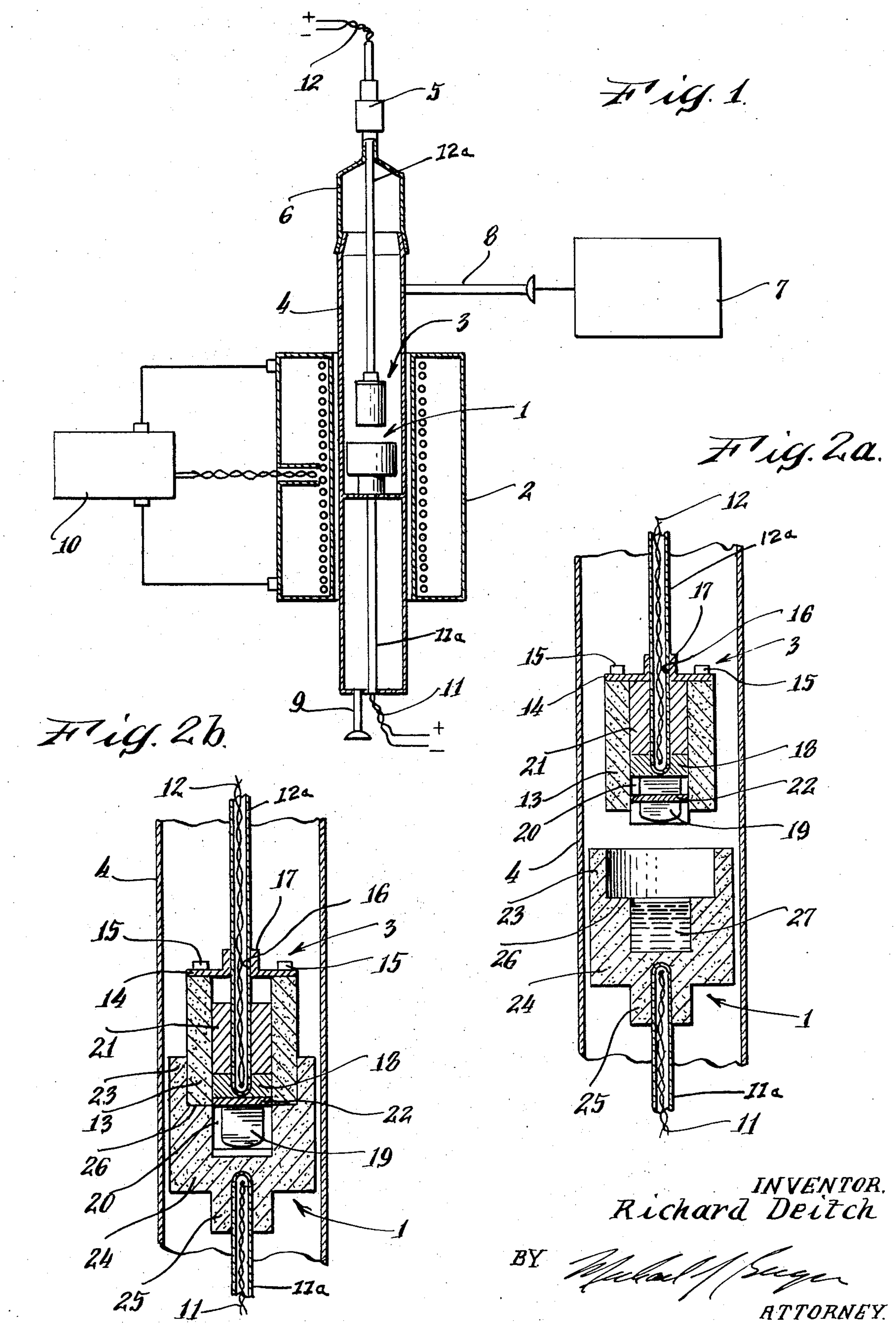
FIG. 1 is a representation of a vertical growth system for carrying out the method of this invention.
FIGS. 2*a* and 2*b* are an enlarged view of a portion of the vertical growth system of FIG. 1.

Referring to FIG. 1, there is shown a vertical growth system for carrying out the method of this invention. This growth system is similar to that used in liquid-phase epitaxy under conditions of thermal equilibrium and comprises a graphite crucible 1 positioned within furnace 2. A graphite substrate holder 3 is attached to the end of the quartz thermocouple tube 12*a* which, in turn, passes through an O-ring seal 5 in the removable top cap 6 of the quartz chamber 4. A covering gas, such as helium or palladium purified hydrogen, may be introduced into quartz chamber 4 from an appropriate supply 7 through upper conduit 8. The gas flows from the top to the bottom of quartz chamber 4 and exits through lower conduit 9. The temperature in various zones within the furnace can be independently adjusted by temperature controller 10. Thermocouple 11 extends through quartz thermocouple tube 11a and monitors the temperature of crucible 1 and thermocouple 12 which extends through tube 12a monitors the temperature of substrate holder 3. In practice, the temperature of the solution within crucible 1 is approximately 10°C lower than the temperature monitored by thermocouple 11 while the temperature of the substrate on substrate holder 3 is approximately 50°C higher than the temperature monitored by thermocouple 12.

Referring to FIGS. 2*a* and 2*b*, there is shown an enlarged view of crucible 1 and substrate holder 3 of FIG. 1. Substrate holder 3 comprises a hollow cylindrical graphite body 13 sealed at the upper end by graphite plate 14 which is secured to body 13 by appropriate means, such as graphite screws 15. Plate 14 has a hole 16 therein and cylindrical sealing member 17 extending upward therefrom. Thermocouple 12 extends upwardly through plate 14 and sealing member 17. Substrate holder 3 further comprises clamp means 18 for securing substrate 19 to flat plate 20. Stop plate 21 extends between clamp 18 and plate 14. Graphite wiper arm 22 extends across the open lower portion of cylindrical body 13 proximate to substrate 19.

Crucible 1 comprises three concentric hollow cylindrical bodies of decreasing diameter, 23, 24 and 25 respectively. A shoulder 26 is formed between cylindrical bodies 23 and 24 and solution 27 is contained within cylindrical body 24.

Figure 3:
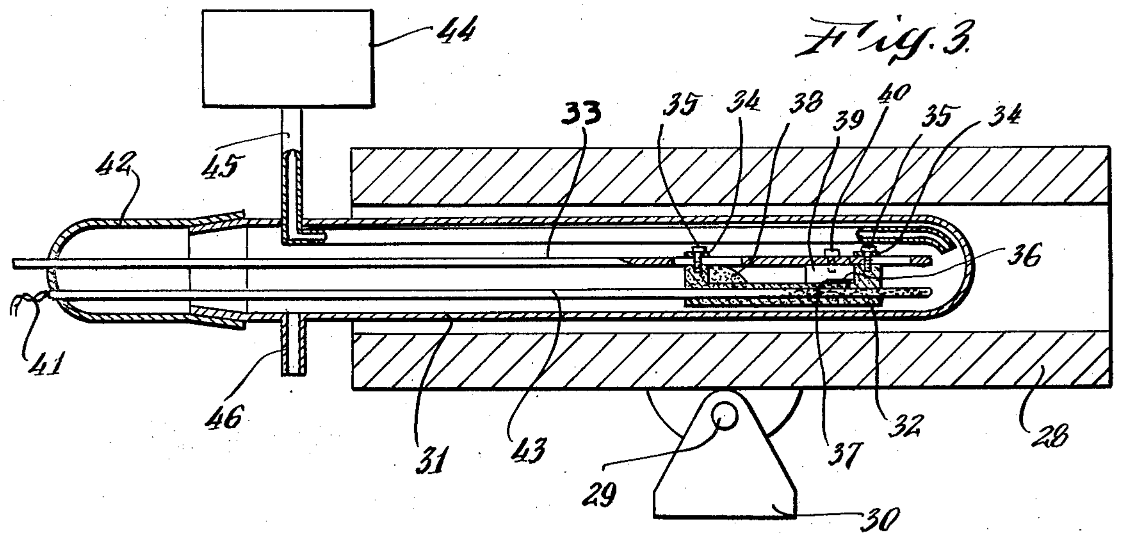
FIG. 3 is a representation of a horizontal growth system for carrying out the method of this invention.

The method of this invention may also be carried out in a horizontal growth system shown in FIG. 3. This system includes a furnace 28, having appropriate temperature control means (not shown), which is pivotal about axis 29 by a suitable tilting meachanism 30. The growth system includes a quartz chamber 31 positioned within the furnace and a graphite boat 32 in the form of a rectangular box positioned within quartz tube 31. The graphite boat comprises wiper rod 33 slidably secured to graphite boat 32 by plate 34 and fastener means 35. Substrate 36 is positioned in depression 37 at one end of boat 32. Initially the boat is tilted so that solution 38 is at the opposite end of the boat. Wiper box 39 is positioned on top of substrate 36 and secured by fasteners 40 to wiper rod 33 so as to slide therewith. Wiper box 39 is preferably made of graphite and the side facing solution 36 is open so as to receive the solution when the furnace is tilted. The horizontal growth system of FIG. 3 further includes thermocouple 41 which extends through end cap 42 of chamber 31. The thermocouple is slidably positioned in quartz tube 43 to monitor the temperature at various points within chamber 31. A covering gas may be introduced into chamber 31 from supply 44 through conduit 45. The gas flows through the chamber and exits through conduit 46.

The method of liquid-phase epitaxial growth under transient thermal conditions can be used for growing thin epitaxial layers of materials from a saturated molten metal solution. In particular, this method can be used to grow thin layers of: single elements: germanium (Ge), silicon (Si), and tin (Sn); binary compounds of: gallium arsenide (GaAs), gallium phosphide (GaP), indium phosphide (InP), gallium antimonide (GaSb), indium arsenide (InAs), indium antimonide (InSb), aluminum antimonide (AlSb), aluminum arsenide (AlAs), zinc selenide (ZnSe), zinc sulfide (ZnS), zinc telluride (ZnTe), cadmium sulfide (CdS), cadmium selenide (CdSe), cadmium telluride (CdTe), silicon carbide (SiC), zinc oxide (ZnO), aluminum phosphide (AlP), and mercury telluride (HgTe); mixed crystal compounds of: aluminum gallium arsenide ($Al_xGa_{1-x}As$), aluminum gallium phosphide ($Al_xGa_{1-x}P$), gallium indium arsenide ($Ga_xIn_{1-x}As$); and ternary compounds of: zinc tin phosphide ($ZnSnP_2$), zinc germanium phosphide ($ZnGeP_2$), zinc silicon phosphide ($ZnSiP_2$), zinc tin arsenide ($ZnSnAs_2$), zinc silicon arsenide ($ZnSeAs_2$), zinc tin antimonide ($ZnSnSb_2$), cadmium silicon phosphide ($CdSiP_2$), cadmium silion arsenide ($CdSiAs_2$), cadmium tin phosphide ($CdSnP_2$), cadmium germanium phosphide ($CdGeP_2$) and magnesium germanium phosphide ($MgGeP_2$).

An epitaxial layer of material is grown on a suitable substrate which is generally composed of the same material as the layer. The solute may be added to the solution either in the form in which it will later be grown or in the form of the component elements.

The invention will be more readily understood from consideration of the following specific examples which are given by way of illustration and are not intended to limit the scope of the inventin in any way.

EXAMPLE I

The vertical growth system of FIGS. 1, 2a and 2b was used to grow from a gallium solution thin epitaxial layers of gallium arsenide on gallium arsenide substrates. The gallium arsenide substrates were prepared from bulk material by use of conventional bulk crystal growth techniques. After initial forming, the substrates were cut with a (100) orientation to proper size and shape, and then lapped and chemi-mechanically polished. The substrates were then chemically cleaned as follows: they were rinsed in warm ethyl alcohol, in hot trichlorethylene, in warm ethyl alcohol again, and then in deionized water. They were next soaked in $HCl:H_2O$ (1:1) at 70°C for at least 5 minutes and again rinsed in deionized water and dried.

The solution was prepared by placing 7.8 grams of gallium arsenide and 70 grams of gallium into crucible 1 and placing the crucible into position in chamber 4. A substrate was then secured on substrate holder 3 and lowered into chamber 4 to a position outside the heated zone of furnace 2. After purging chamber 4 with helium gas, the covering gas, palladium-purified hydrogen, was introduced into the chamber. The temperature of the crucible was raised to a monitored temperature of about 810°C, indicating an actual solution temperature of about 800°C to produce a saturated gallium solution.

Figure 4:
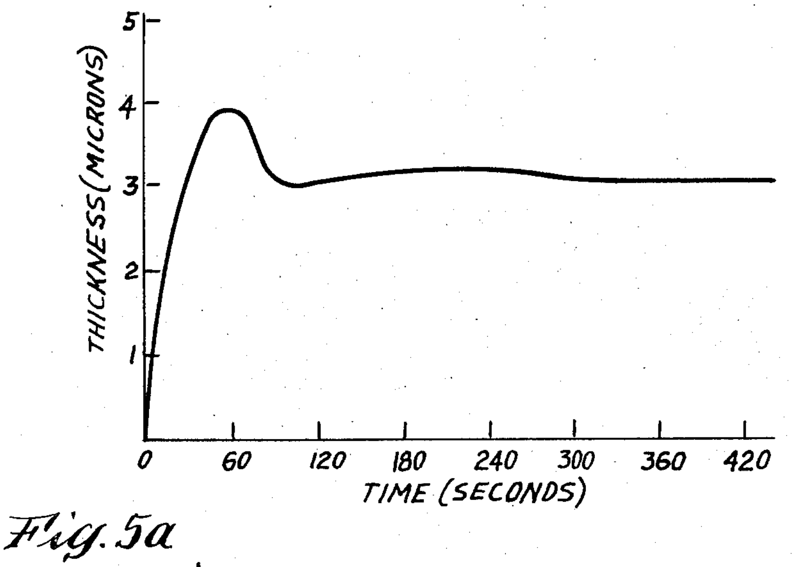
FIG. 4 is a graph showing the epitaxial layer thickness as a function of the immersion time of a gallium arsenide substrate in a gallium solution.

The substrate holder was then lowered into the furnace to a zone above the crucible by translating thermocouple tube 12*a*. The substrate was thereby heated to a monitored temperature of about 700°C indicating an actual substrate temperature of about 750°C. After the respective temperatures of substrate and solution were stabilized, the substrate holder was lowered until the bottom of cylindrical body 13 rested on shoulder 26 of crucible 1 (FIGS. 2*a* and 2*b*). Substrate 19 on plate 20 was then lowered into solution 27 while the furnace temperature was maintained constant in the zone where the substrate and solution were located. After a predetermined period of time, the substrate was removed from the solution by upward translation of thermocouple tube 12*a*, thereby raising substrate 19 and plate 20. As the substrate was raised, it slid past graphite wiper arm 22, which effectively, without any direct pressured contact, wiped all excess solution from the surface of the substrate. The substrate was raised until stop plate 21 reached plate 14 after which the substrate holder and enclosing cylinder 13 were together further translated upward to a position outside the heated zone of the furnace and held there until cooled to room temperature. This procedure was repeated several times wherein only the duration of contact between the substrate and solution was varied. The results are shown in FIG. 4.

Figure 5A:
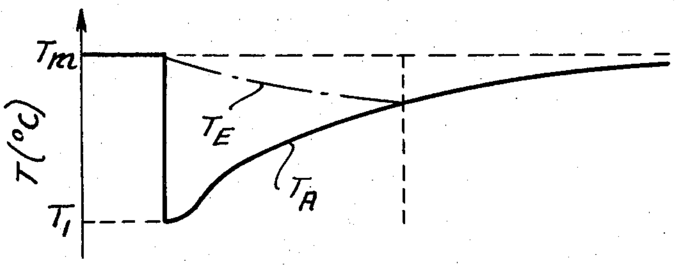
FIGS. 5*a* and 5*b* are idealized graphs showing the variation with time of temperature and saturation respectively in a solution proximate to the substrate.
Figure 5B:
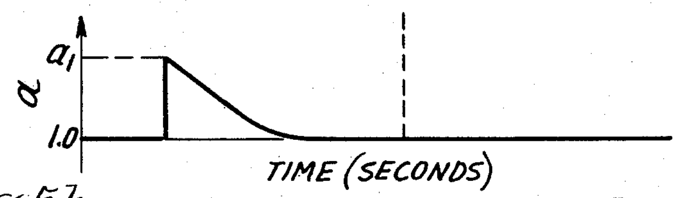

A better understanding of the method of this invention may be had by reference to FIGS. 5*a* and 5*b*, in which the general thermal history of the solution proximate to the substrate is is shown by FIG. 5*a* and the state of saturation of the solution proximate the substrate shown by FIG. 5*b*. The saturation coefficient, $a$, is defined as the ratio of the actual concentration of solute in the solvent, $C_A$, to the equilibrium concentration of solute in the solvent, $C_E$. A value $a = 1$ corresponds to a saturated solution, a value of $a > 1$ corresponds to a super-saturated solution and a value of $a > 1$ corresponds to an under-saturated solution. The preferred condition of a solution at a particular temperature is saturation ($a = 1$), and, therefore, the solution will tend to return to saturation if it is placed in a supersaturated or undersaturated state. $C_A$ determines the equilibrium temperature, $T_E$, while $C_E$ is the equilibrium concentration of the solution for the actual temperature, $T_A$.

Referring to FIG. 5*a*, $T_m$ is the starting solution temperature. When the cooler substrate is immersed in the hotter solution, a steep temperature gradient is set up across the solution/substrate interface and the temperature of the solution proximate to the substrate decreases rapidly to a temperature of $T_1$. This sudden temperature drop causes a sharp increase in a (FIG. 5*b*) from its initial value of unity to a value of $a_1$. As heat is continually being furnished to the solution from the furnace, the solution and substrate gradually heat up, a continually decreases towards unity as the induced supersaturation is relieved, and material is deposited as an epitaxial layer on the substrate. Although the epitaxial layer growth rate is initially high, the temperature gradient at the growth interface is sufficiently high to prevent constitutional supercooling which could lead to poor crystal growth, as, for example, inclusions of solvent in the crystal layer. When $a$ returns to unity, which occurs when $T_E$ equals $T_A$, equilibrium is reestablished in the solution proximate to the substrate and growth due to transient thermal conditions ceases. If the furnace temperature is decreased after equilibrium is reestablished, normal liquid-phase epitaxial growth will occur on top of the layer grown under transient thermal conditions.

EXAMPLES II – IX

The procedure of Example I was repeated except that the initial conditions for growth were varied. Table below summarizes the results obtained.

TABLE

| Example | Substrate | Solution Composition (grams) | | Substrate Temp.(°C)* | Solution Temp.(°C)** | Dip Time (sec.) | Layer Thickness (micrometers) |
|---|---|---|---|---|---|---|---|
| | GaAs | Ga | GaAs | | | | |
| II | | 70 | 7.92 | 725 | 807 | 60 | 3.1 |
| III | | 70 | 7.92 | 714 | 800 | 15 | 1.0 |
| IV | | 70 | 7.92 | 707 | 810 | 120 | 5.0 |
| V | | 70 | 7.92 | 705 | 813 | 30 | 2.2 |
| VI | | 70 | 7.92 | 717 | 826 | 60 | 5.0 |
| VII | | 70 | 7.95 | 686 | 803 | 15 | 1.9 |
| VIII | | 70 | 7.95 | 737 | 803 | 90 | 4.0 |
| IX | | 70 | 7.95 | 649 | 802 | 90 | 4.5 |

* Monitored temperature – Actual substrate temperature about 50°C higher
**Monitored temperature – Actual solution temperature about 10°C lower

EXAMPLE X

A thin epitaxial layer of gallium arsenide was grown on a gallium arsenide substrate using the horizontal growth system of FIG. 3.

A gallium arsenide substrate was prepared from bulk material as in Example I and placed in graphite boat 32. A solution was prepared by placing 0.36 gram of gallium arsenide and 20 grams of gallium in the graphite boat which was initially positioned to maintain the solution and substrate separate. Wiper box 39 was then placed over the substrate and wiper arm 33 secured to the graphite boat and wiper box. The entire assembly was then placed in quartz chamber 31 outside the heated zone of the furnace. The chamber was initially tilted to preserve the separation of the substrate and solution. After the chamber was purged with helium gas, a covering gas of palladium purified hydrogen was introduced through conduit 45. The graphite boat was then slowly moved into the heated zone of the furnace. The temperature of the furnace was controlled so that the actual solution temperature was 720°C and the actual substrate temperature was 714°C.

With the respective temperatures of substrate and solution stabilized, the furnace was pivoted about axis 29 permitting the solution to flow through the opening in the front of wiper box 39 and over the surface of substrate 36. After a predetermined period of time, the furnace was pivoted in the opposite direction so that the solution rolled off the substrate. To assure complete removal of solution, wiper box 39 was pulled over substrate 36 by translating wiper rod 33 immediately after the furnace was pivoted. After the wiping operation was performed, the graphite boat was slowly removed from the heated zone, cooled to about 50°C under hydrogen, and removed from chamber 31 under helium. An epitaxial layer of gallium arsenide approximately 1 micrometer thick grew on a gallium arsenide substrate if contact between solution and substrate was terminated after about 3 seconds.

EXAMPLE XI

Thin layers of aluminum gallium arsenide ($Al_xGa_{1-x}As$) were grown using the method of this invention in the vertical growth system of FIGS. 1, 2*a* and 2*b*. The procedures of Example I were followed except as otherwise noted.

A solution was prepared by placing 50 grams of gallium, 2.9 grams of gallium arsenide, 0.23 gram of aluminum and an additional 0.005 gram of tellurium for doping purposes, in crucible 1.

A gallium arsenide substrate, formed from bulk material as in Example I, was then placed on substrate holder 3 and lowered into the chamber outside the heated zone of the furnace. After purging with helium, heating was carried out in a palladium-purified hydrogen atmosphere.

The solution was heated to an actual temperature of about 804°C and the substrate was then lowered to a position in the heated zone of the furnace above the crucible and heated to about 754°C. The substrate was dipped into the solution while the furnace temperature was maintained constant and then withdrawn from the solution after a predetermined time as in Example I. A layer of aluminum gallium arsenide about 2.5 micrometers thick grew on the substrate after the substrate and solution had been maintained in contact for a period of 150 seconds.

What is claimed is:

1. A method for growing thin epitaxial layers of semiconductive crystalline material onto a semi-conductive substrate from a solution comprising a metal solvent, and a solute semiconductive material comprising the desired product of the growth, comprising the steps of:

a. heating the solution to a temperature to produce saturation;
b. heating the substrate to a temperature at least 5°C lower than that of the solution and up to 100°C lower than that of the solution;
c. bringing the substrate into contact with the solution for inducing a supersaturated condition in the solution proximate to the substrate, and initiating transient mode crystalline growth; and
d. removing the substrate from the solution after a predetermined interval.

2. The method of growing a thin epitaxial layer of gallium arsenide from a gallium solution on a gallium arsenide substrate comprising the steps of:

a. heating the gallium solution to produce saturation;
b. heating the gallium arsenide substrate to a temperature at least 5° lower than the temperature of the solution and up to 100°C lower than that of the solution;
c. bringing the gallium arsenide substrate into contact with the saturated gallium solution for inducing a supersaturated condition in the solution proximate to the substrate, and initiating transient mode crystalline growth; and
d. removing the substrate from the solution after a predetermined interval of time.

3. The method of claim 2 wherein the gallium arsenide substrate is between 50°C and 100°C cooler than the saturated gallium solution.

4. The method of claim 2 wherein the saturated gallium solution is about 800°C and the gallium arsenide substrate is initially at a temperature in the range of about 750° – 700°C.

5. The method of claim 4 wherein the substrate is removed from the solution after about 30 to 120 seconds.

6. A method for growing a thin epitaxial layer of aluminum gallium arsenide onto a gallium arsenide substrate comprising the steps of:

a. preparing a solution of gallium arsenide and aluminum in gallium;
b. heating the solution to a temperature to produce saturation;
c. heating the gallium arsenide substrate to a temperature at least 5°C lower than that of the saturated solution and up to 100°C lower than that of the solution;
d. bringing the substrate into contact with the saturated solution for inducing a supersaturated condition proximate to the substrate, and initiating transient mode crystalline growth; and
e. removing the substrate from the solution after a predetermined period of time.

7. The method of claim 6 wherein the temperature of said solution is about 800°C and the temperature of said substrate is about 750°C.

8. The method of claim 7 wherein the substrate is removed from the solution after 150 seconds.

* * * * *

PO-1050
(5/69)

UNITED STATES PATENT OFFICE
CERTIFICATE OF CORRECTION

Patent No. 3,791,887 Dated February 12, 1974

Inventor(s) RICHARD DEITCH

It is certified that error appears in the above-identified patent and that said Letters Patent are hereby corrected as shown below:

Column 4, line 19, "inventin" should be --invention--.
Column 5, line 34, "$\alpha > 1$" should be --$\alpha < 1$--.
Column 5, line 53, "a" should be -- $\alpha$ --.
Column 7, line 22, "semi-conductive" should be --semiconductive--.
Column 8, line 1, "$5^{o}$" should be --$5^{o}C$--.

Signed and Sealed this

*twenty-third* Day of *December 1975*

[SEAL]

*Attest:*

RUTH C. MASON
*Attesting Officer*

C. MARSHALL DANN
*Commissioner of Patents and Trademarks*